United States Patent
Bolognia

(10) Patent No.: US 10,431,512 B2
(45) Date of Patent: Oct. 1, 2019

(54) SEMICONDUCTOR PACKAGE WITH BARRIER FOR RADIO FREQUENCY ABSORBER

(71) Applicant: ANALOG DEVICES, INC., Norwood, MA (US)

(72) Inventor: David Frank Bolognia, Charlestown, MA (US)

(73) Assignee: Analog Devices, Inc., Norwood, MA (US)

( * ) Notice: Subject to any disclaimer, the term of this patent is extended or adjusted under 35 U.S.C. 154(b) by 22 days.

(21) Appl. No.: 15/607,265

(22) Filed: May 26, 2017

(65) Prior Publication Data

US 2017/0330812 A1 Nov. 16, 2017

Related U.S. Application Data

(62) Division of application No. 15/066,454, filed on Mar. 10, 2016, now Pat. No. 9,666,538.

(51) Int. Cl.
| | |
|---|---|
| *H01L 23/18* | (2006.01) |
| *H01L 23/552* | (2006.01) |
| *H01L 23/053* | (2006.01) |
| *H01L 23/66* | (2006.01) |
| *H01L 23/538* | (2006.01) |
| *H01L 23/31* | (2006.01) |
| *H01L 23/26* | (2006.01) |

(52) U.S. Cl.
CPC ............ *H01L 23/18* (2013.01); *H01L 23/053* (2013.01); *H01L 23/26* (2013.01); *H01L 23/3107* (2013.01); *H01L 23/5389* (2013.01); *H01L 23/552* (2013.01); *H01L 23/66* (2013.01); *H01L 2223/6644* (2013.01); *H01L 2224/32145* (2013.01); *H01L 2924/14* (2013.01)

(58) Field of Classification Search
CPC ........... H01L 2224/32145; H01L 23/18; H01L 23/26; H01L 23/3107; H01L 23/552; H01L 23/66; H01L 23/053
See application file for complete search history.

(56) References Cited

U.S. PATENT DOCUMENTS

| | | | |
|---|---|---|---|
| 5,491,361 A | 2/1996 | Stupian et al. | |
| 5,543,364 A | 8/1996 | Stupian et al. | |
| 6,657,523 B2 | 12/2003 | Tarui et al. | |
| 6,853,062 B1 * | 2/2005 | Saito | H01Q 17/00 |
| | | | 257/682 |
| 6,958,260 B2 | 10/2005 | Bedinger et al. | |

(Continued)

OTHER PUBLICATIONS

Thompson, et al., "Packaging of MMICs in Multilayer LCP Substrates," IEEE Microwave and Wireless Components Letters, vol. 16, No. 7, Jul. 2006 in 3 pages.

*Primary Examiner* — Ngan V Ngo
(74) *Attorney, Agent, or Firm* — Knobbe, Martens, Olson & Bear, LLP

(57) ABSTRACT

Semiconductor packages and methods of manufacturing semiconductor packages are described herein. In certain embodiments, the semiconductor package includes a housing including a first compartment and a second compartment, the first and second compartments being divided from one another. The semiconductor package can also include an integrated device die disposed in the first compartment, and a radio frequency (RF) absorber disposed in the second compartment.

22 Claims, 9 Drawing Sheets

(56) References Cited

U.S. PATENT DOCUMENTS

| | | |
|---|---|---|
| 8,008,753 B1 | 8/2011 | Bolognia |
| 8,013,775 B2 | 9/2011 | Woods |
| 9,666,538 B1 * | 5/2017 | Bolognia .............. H01L 23/552 |
| 2002/0151103 A1 * | 10/2002 | Nakamura .......... H01L 23/3128 438/106 |
| 2008/0266830 A1 * | 10/2008 | Woods .................. H01L 23/552 361/818 |
| 2010/0006327 A1 * | 1/2010 | Yu ........................ H05K 1/0284 174/258 |
| 2014/0183709 A1 | 7/2014 | Gilliland et al. |
| 2015/0076628 A1 | 3/2015 | Bolognia et al. |
| 2016/0218420 A1 | 7/2016 | Leung et al. |
| 2017/0018590 A1 * | 1/2017 | Yiu ................... H01L 27/14634 |
| 2017/0033058 A1 * | 2/2017 | Li ........................ H01L 23/3107 |
| 2017/0077022 A1 * | 3/2017 | Scanlan ............ H01L 23/49838 |
| 2017/0179001 A1 * | 6/2017 | Brunschwiler ....... H01L 23/473 |
| 2017/0294401 A1 * | 10/2017 | Suthiwongsunthorn ..................... H01L 24/45 |

* cited by examiner

SEMICONDUCTOR PACKAGE WITH BARRIER FOR RADIO FREQUENCY ABSORBER

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

The present disclosure relates generally to a semiconductor package with a barrier for a radio frequency (RF) absorber and manufacturing methods therefor.

Description of the Related Art

Various types of semiconductor packages may include very high frequency RF integrated device dies (e.g., transmitter or receiver front ends) that may cause interference with or otherwise disturb electronic components outside the package. Package lids may be used to contain the RF emissions emitted from within a package, such as, for example, from within packages having high frequency device dies (e.g., E-band or other high frequency devices). While such lids can advantageously shield surrounding circuit components from electromagnetic interference, the lids may also cause unpredictable and electrically disruptive cavity resonances inside the package, which can disturb the circuit components therein. To resolve these potential problems, RF absorbers may be disposed inside the package to dampen and/or absorb the RF waves emitted by the device dies in the package. However, the materials which form portions of some RF absorbers may release gases such as hydrogen and sulfur (among other gases) in sealed environments. Such outgassing can damage active components in various types of integrated device dies. To protect the device dies from the outgassing, a gettering material may be disposed inside the cavity of the package.

However, gettering materials are expensive, and their hydrogen removal efficiency can decrease over time. As a result, the production of high frequency devices in large quantities can become prohibitively expensive with the incorporation of gettering materials. Moreover, as the hydrogen removal efficiency of the gettering material decreases, the hydrogen outgassed from RF absorbers may eventually contaminate the dielectric materials inside the cavity and degrade the circuit components therein. Accordingly, there is a continuing need for a low cost package housing that effectively shields external components from RF emissions from the package and that that also prevents contamination due to outgassing from the RF absorber.

SUMMARY OF SOME EMBODIMENTS

The systems, methods, and devices described herein each have several aspects, no single one of which is solely responsible for its desirable attributes. Without limiting the scope of this invention as expressed by the claims which follow, some features are described briefly below. After considering this description, and particularly after reading the section entitled "Detailed Description of Some Embodiments," one will understand the advantageous features of the systems, methods, and devices described herein.

In some aspects, a semiconductor package with a radio frequency (RF) absorber is disclosed. The semiconductor package can include a housing comprising a first compartment and a second compartment, the first and second compartments being divided from one another, an integrated device die disposed in the first compartment, and a radio frequency (RF) absorber disposed in the second compartment.

In some aspects, a lid assembly for a semiconductor package is disclosed. The lid assembly can include a lid and a radio frequency (RF) absorber. The lid can include a cover and a partition. The cover and the partition can cooperate to define a compartment between the cover and the partition and the RF absorber can be disposed in the compartment.

In some aspects, a semiconductor package with a lid having a compartment is disclosed. The semiconductor package can include a substrate, a frame, an integrated device die mounted to the substrate, and a lid mounted to at least one of the frame and substrate over the integrated device die. The lid, frame, and substrate can at least partly define a cavity in which the integrated device die is disposed. The lid can include a compartment formed therein and the compartment can be separated from the cavity by a partition.

Details of one or more embodiments of the subject matter described in this application are set forth in the accompanying drawings and the description below. Any of the features, components, or details of any of the arrangements or embodiments disclosed in this application are combinable and modifiable to form myriad new arrangements and embodiments that fall within the spirit and scope of this disclosure. Other features, aspects, and advantages will also become apparent from the description, the drawings, and the claims. Note that the relative dimensions of the following figures may not be drawn to scale.

BRIEF DESCRIPTION OF THE DRAWINGS

Embodiments will now be described with reference to the following drawings, which are provided by way of example, and not limitation. Like reference numerals indicate identical or functionally similar elements.

DETAILED DESCRIPTION OF SOME EMBODIMENTS

Embodiments of the present disclosure provide lids for semiconductor packages. Lids for semiconductor packages are provided which define cavities for RF absorbers that are separate from the cavities which house integrated device dies, and methods of manufacturing the same are provided. While certain embodiments are described below, these embodiments are presented by way of example only, and can be embodied in myriad different ways as defined and covered by the claims.

In various embodiments disclosed herein, a semiconductor package can comprise a housing having a first compartment and a second compartment sealed from the first compartment. An integrated device die (such as a high frequency die) can be disposed in the first compartment, and an RF absorber can be disposed in the second compartment. As explained above, some types of integrated device dies (such as high frequency device dies) emit RF waves which may interfere with components outside the package. In various embodiments, the housing can comprise a metallic portion (e.g., a metallic lid) which acts to contain the RF waves within the package and to shield external components from the RF waves. Providing the metallic portion or lid may also introduce resonances within the package cavity which can negatively affect the performance of various components in the package. The RF absorber can advantageously dampen and/or absorb the RF waves emitted by the integrated device die. In the disclosed embodiments, the RF absorber can be separated from the integrated device die such that any outgassing from the RF absorber does not contaminate or degrade the integrated device die. In some arrangements, a ventilation hole is provided to provide fluid communication between the second compartment with the RF absorber and the outside environs to allow any gases from the RF absorber to escape the package without harming the die. Gettering materials, such as palladium, can advantageously be omitted from the packaging materials.

Figure 1:
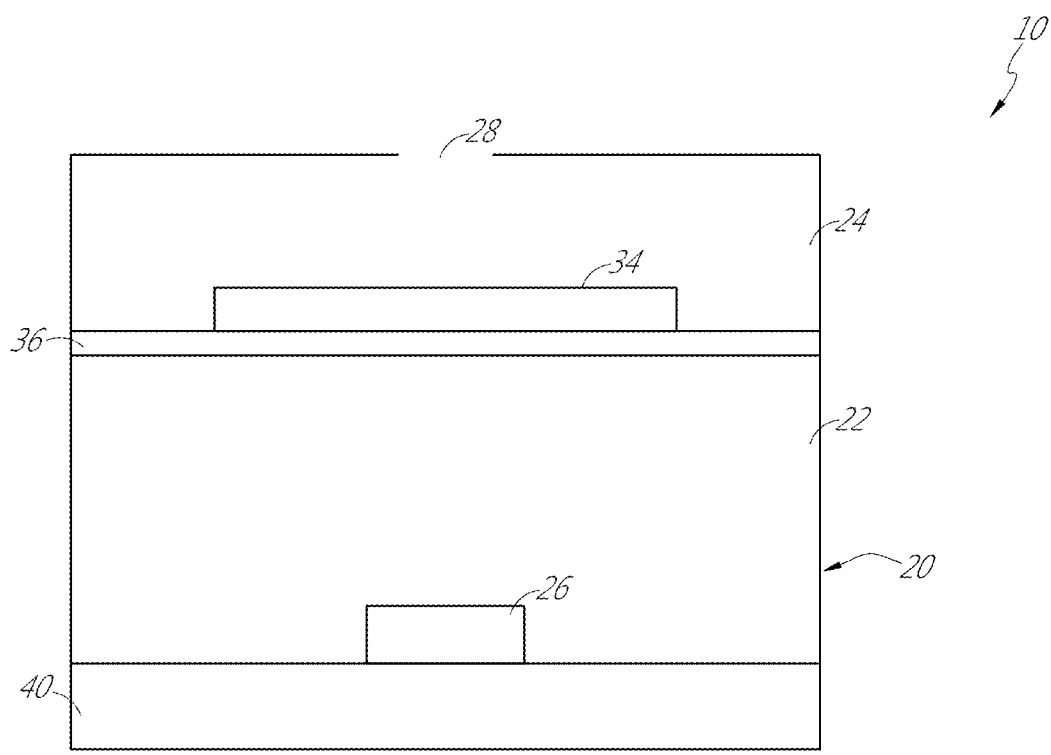
FIG. 1 is a schematic side sectional view of a semiconductor package with two separate cavities, in accordance with some embodiments.

FIG. 1 is a schematic side sectional view of a semiconductor package 10 with two separate cavities (also referred to as compartments), according to various embodiments. As shown in FIG. 1, the semiconductor package 10 defines a housing 20 including a first cavity 22 and a second cavity 24. An integrated device die 26 can be disposed inside the first cavity 22. An RF absorber 34 can be disposed inside the second cavity 24. In some embodiments, additional features may be disposed in the first and/or second cavities 22, 24. For example, in some embodiments, two or more integrated device dies can be disposed in the first cavity 22. In addition, in some embodiments, multiple components may cooperate to form the first cavity 22, and multiple components may cooperate to form the second cavity 24. For example, as shown and described in more detail below with reference to FIGS. 2A and 2B, as well as other figures, in various embodiments, a lid and a substrate can cooperate to form the first cavity 22. In some embodiments, one or more portions of the lid can cooperate to form the second cavity 24, such that the second cavity 24 is defined within the lid. As also shown and described below in connection with FIGS. 4D-7B, in various embodiments, the first cavity 22 can be additionally compartmentalized into two or more sub-cavities, for example, for supporting and housing a plurality of integrated device dies and/or passive electronic components.

In FIG. 1, the portions of the housing 20 can contain radio-frequency waves emitted from the integrated device die 26 so that they do not disturb system components outside of the semiconductor package 10. For example, portions of the housing 20 which define the first and second cavities 22, 24 can comprise metal, or metal-coated surfaces, which can shield external components from the RF waves. However, as explained above, the housing 20 may create electromagnetic resonance conditions within the package 10, which can interfere with the operation of components in the package 10. Advantageously, the RF absorber 34 disposed in the second cavity 24 can dampen cavity resonances caused by such containment by absorbing RF waves emitted from the integrated device die 26. The RF absorber 34 can comprise any suitable type of absorber. For example, in some embodiments, the RF absorber 34 can comprise a ferromagnetic material, for example, comprising nickel, and/or iron.

The integrated device die 26 can be any suitable die for any suitable application. For example, in some embodiments, the integrated device die 26 can be designed and packaged for high frequency applications, such as, for example, wave guide launch platforms, high speed fiber optic applications, high frequency military applications, communications infrastructure (e.g., point-to-point communication in the E-frequency band), cellphone backbones, radars, and the like. In some embodiments, the integrated device die 26 can comprise a gallium arsenide (GaAs) die, a gallium nitride (GaN) die, or any suitable type of Group III-V semiconductor die, among others. Such material sets may be particularly sensitive to hydrogen outgassing from the RF absorber 34. The die 26 can comprise any suitable type of high frequency dies, such as transceivers, receivers, power amplifier modules. Further, it should be appreciated that the first and second cavities 22, 24 can house any number of suitable integrated device dies or other electronic components or devices.

In FIG. 1, the first and second cavities 22, 24 are sealed from one another by a partition 36 such that the features in the first cavity 22 are isolated from the features in the second cavity 24. The partition 36 can therefore prevent fluids (e.g., gases) from passing from the second cavity 24 to the first cavity 22, and vice versa. For example, in certain embodiments, the first and second cavities 22, 24 are sealed at least partly by the partition 36 such that the integrated device die 26 in the first cavity 22 is isolated from the RF absorber 34 in the second cavity 24, as well as from any gas (e.g., hydrogen gas) that the RF absorber 34 releases (also referred to as outgassing). In some embodiments, the RF absorber 34 is adhered to an inside surface of the second cavity 24, such as, for example, a top surface of the partition 36. Advantageously, the partition 36 inhibits or prevents outgassed hydrogen (or other gases) in the second cavity 24 from permeating into the first cavity 22 and contaminating the dielectric materials inside, which consequently inhibits or prevents the integrated device die 26 and other active components inside the first cavity 22 from degrading due to hydrogen exposure (also referred to as hydrogen poisoning). In some embodiments, the second cavity 24 and partition 36 cooperate to effectively quarantine outgassed hydrogen or other gases from the features inside first cavity 22. As a result, in certain embodiments, no gettering material (e.g., palladium or any other gettering material) need be disposed in either the first or second cavity 22, 24. The partition 36 preferably passes RF waves and accordingly is preferably non-metal, such as ceramic or plastic. For example, the partition 36 can be a molded liquid crystal polymer (LCP).

Thus, the semiconductor package 10 in FIG. 1 addresses a major problem currently associated with RF absorbers in semiconductor packages: hydrogen outgassing and the concomitant use of expensive gettering material. For example, as shown in FIG. 1, the first and second cavities 22, 24 can be sealed from one another such that the RF absorber 34 is outside the first cavity 22 where outgassing does not affect the active circuit components in the first cavity 22. The package 10 may advantageously be relatively low-profile and lightweight, while effectively shielding external components from electromagnetic radiation generated within the package 10. In addition, in certain embodiments, no active circuit components are disposed in the second cavity 24. In such embodiments, the RF absorber 34 can be disposed in the second cavity 24 without the use of expensive gettering material, such as, for example, palladium, which is also difficult to adhere to the housing 20. As will be described in more detail below, the second cavity 24 can isolate the RF absorber 34 from the die(s) within the first cavity 22. For example, in some embodiments, the second cavity 24 can be arranged to quarantine the outgassed hydrogen of the RF absorber 34, and/or in some embodiments, the second cavity 24 can be arranged to allow the outgassed hydrogen from the RF absorber 34 to diffuse out of the second cavity 24 to the outside environs.

In certain embodiments, the material of the RF absorber 34 can be a ferromagnetic material, for example, comprising nickel, and/or iron as well as any other suitable RF absorber material, and in certain embodiments, the material of the partition 36 can be plastic, such as liquid crystal polymer (LCP), as well as any other suitable non-metal, and/or composite material that allows radio-frequency waves to pass through. For example, in certain embodiments, the partition 36 can be a metal coated plastic.

Further, although FIG. 1 illustrates a semiconductor package 10 that includes two separate cavities 22, 24, it should be appreciated that any suitable number of separate cavities can be defined by the housing 20. For example, in certain embodiments, the housing 20 can define two to six cavities, or more, such as, for example, 2, 3, 4, 5, 6, or more cavities. One or more of these cavities can house an RF absorber or an integrated device die and can be sealed from any number of the other cavities by one or more partitions such that that hydrogen outgassed into any cavity including an RF absorber is quarantined therein and/or allowed to diffuse outside the semiconductor package 10, but not to the cavity housing the device(s) 26, as will be described in more detail below. In addition, it should be appreciated that any of the one or more cavities can be compartmentalized into two or more sub-cavities, each of which can likewise house an RF absorber or integrated device die. For example, in some embodiments, the first cavity 22 can be compartmentalized into two or more sub-cavities, and in some embodiments, the second cavity 22 can be compartmentalized into two or more sub-cavities. In such embodiments, the two or more sub-cavities can be sealed from one another and/or from one or more of the other cavities. Of course, it should be appreciated that any suitable number of RF absorbers and integrated device dies can be disposed in the cavities and/or sub-cavities formed within the semiconductor package 10. However, it should also be appreciated that one or more of the cavities and/or sub-cavities may include components other than an integrated device die or an integrated RF absorber.

As also shown in FIG. 1, in some embodiments, the second cavity 24 can include one or more ventilation holes 28 to facilitate hydrogen diffusion out of the second cavity 24 to the outside environs. For example, FIG. 1 illustrates a ventilation hole 28 through the housing 20 at or near the top of the second cavity 24. Of course, it should be appreciated that the one or more ventilation holes 28 can be formed at any suitable position around the perimeter of the second cavity 24, such as, for example, on the sides of the second cavity 24. In some embodiments, the one or more ventilation holes 28 define an opening having an area in the range of 0.1 $mm^2$ to 3 $mm^2$, such as about 0.3 $mm^2$ to 2.5 $mm^2$, or any other suitable area. It should be appreciated that the one or more ventilation holes 28 can be any suitable size and any suitable shape, such as, for example, square and/or circular ventilation holes with any of the aforementioned areas, among others.

Thus, in some embodiments, such as that illustrated in FIG. 1, the package 10 can include one or more ventilation holes 28 to help vent the outgassed fluids from the package 10. However, the one or more ventilation holes 28 can be useful in other applications as well, such as, for example, medical imaging (e.g., for X-ray shielding), space applications where gamma rays can damage or otherwise interfere with equipment, among others. Further, in some embodiments, the RF absorber 34 can instead comprise a different type of absorber, such as, for example, an acoustic absorber for use in ultrasound applications to dampen noise that could otherwise degrade the ultrasound signal.

As further illustrated in FIG. 1, in some embodiments, the first cavity 22 is partly defined by a substrate 40 to which the integrated device die 26 is mounted. The substrate 40 can comprise any suitable type of substrate, including, e.g., a printed circuit board (PCB) substrate, a molded leadframe substrate, a ceramic substrate, etc. Bond wires (not shown) can provide an electrical connection between the integrated device die 26 and the substrate 40 in various embodiments. In other embodiments, a flip-chip connection, through silicon vias and solder bumps, or other electrical interconnection methods may be used in lieu of bond wires to electrically connect the integrated device die 26 to the substrate 40. In some embodiments, the integrated device die 26 can be mounted onto a die attach pad (not shown). In some embodiments, the semiconductor package shown in FIG. 1 can take on different arrangements without departing from the spirit and scope of this disclosure. For example, in certain embodiments, the semiconductor package 10 can take the form of a pre-molded lead frame, having cavities defined therein, including cavities similar to the first and second cavities 22, 24. The cavities of the pre-molded lead frame, or of any other suitable semiconductor packaging arrangement, can likewise be arranged to isolate an RF absorber in a cavity separate from the cavities in which the integrated device dies are disposed.

Figure 2:
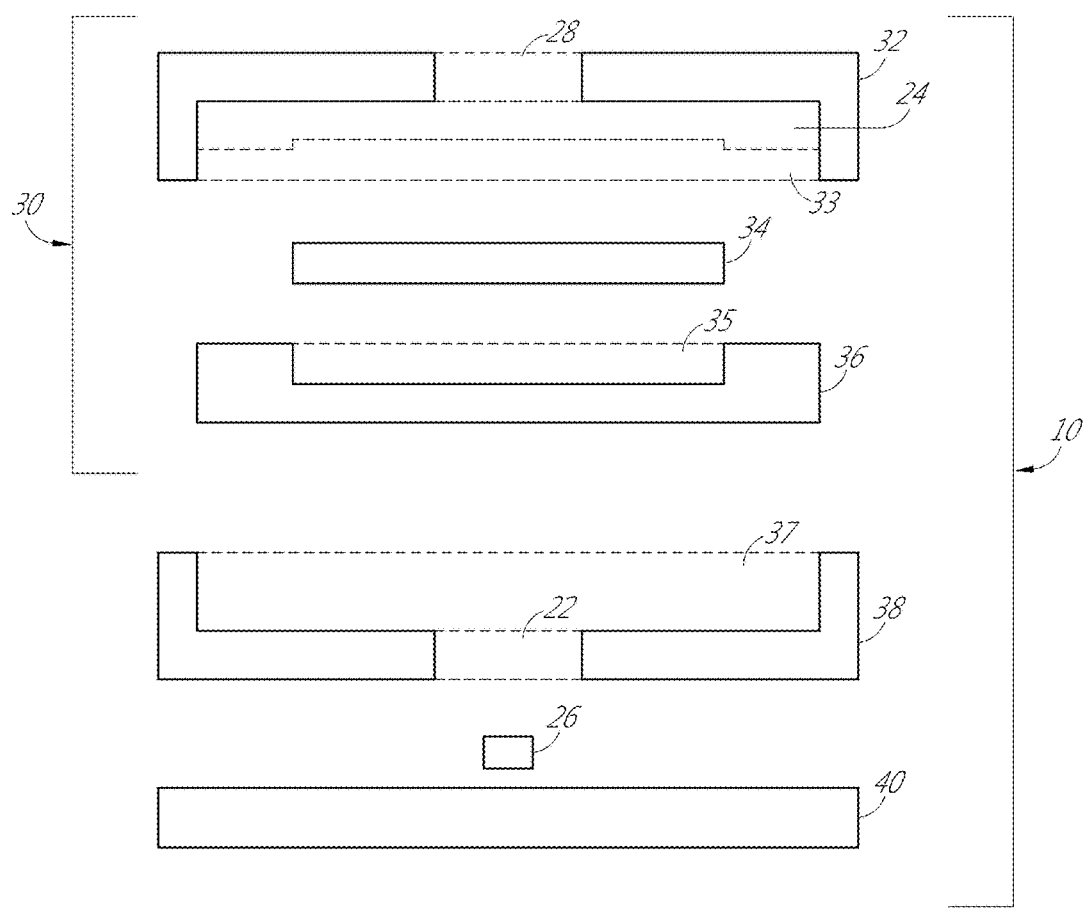
FIG. 2 is an exploded side sectional view of a semiconductor package, according to some embodiments.

FIG. 2 is an exploded side sectional view of a semiconductor package 10, according to some embodiments. Unless otherwise noted, reference numerals in FIG. 2 refer to components that are the same or generally similar to those illustrated above in FIG. 1. As shown in FIG. 2, the semiconductor package 10 includes multiple features intended to be combined together to define a cavity for an RF absorber and a separate cavity for an integrated device die. For example, in the illustrated embodiment, the semiconductor package 10 includes a lid 30, a frame 38, an integrated device die 26, and a substrate 40. The lid 30 can be flat or shaped to define a concavity. The lid 30 can be a composite lid and include a cover 32, a partition 36, and an RF absorber 34 disposed within the lid 30 between the cover 32 and the partition 36. Further, the lid 30 and the substrate 40 can cooperate to define the first cavity 22. The cover 32 and the partition 36 can cooperate to define the second cavity 24. Similar to FIG. 1, the integrated device die 26 can be disposed in the first cavity 22, and the RF absorber 34 can be disposed in the second cavity 24. In addition, in some embodiments, the lid 30 can include more or less than three components. For example, in some embodiments, the cover 32 and the partition 36 can be manufactured as a single component that likewise defines a second cavity 24.

The cover 32 can include one or more ventilation holes 28 as described above with reference to FIG. 1. Advantageously, the ventilation hole(s) 28 can enable outgassing to escape the package 10 without contaminating the die 26. Further, in some embodiments, the cover 32 can include a recess 33 sized and shaped to receive at least a portion of the RF absorber 34 and at least a portion of the partition 36. As shown in FIG. 2, the partition 36 can define a recess 35 sized and shaped to receive at least a portion of the RF absorber 34. The concavities of the recesses 33, 35 can be oriented opposite one another and can cooperate to enclose the RF absorber 34 within the second cavity 24.

Although a frame 38 is illustrated in FIG. 2, it should be appreciated that other embodiments may not include such a frame. In the illustrated embodiment of FIG. 2, the first cavity 22 can be partly defined by the substrate 40, the partition 36, and/or the frame 38 once the lid 30 is attached to the substrate 40. For example, the first cavity 22 can be partly defined by the substrate 40, one or more internal walls of the frame 38, and the partition 36 once the lid 30 is attached to the substrate 40 and/or the frame 38. In some embodiments, the frame 38 partly defines the first cavity 22 or two or more sub-cavities (also referred to as compartments). For example, the frame 38 in FIG. 2 partly defines the first cavity 22 but does not separate it into two or more sub-cavities. As shown in FIG. 2, the frame 28 can include a recess 37 sized and shaped to receive a portion of the partition 36. The partition 36 can form the top (also referred to as the ceiling) of the first cavity 22 and/or its sub-cavities. In addition, the frame 38 can form an electrical connection to the substrate 40 and can be mounted directly or indirectly thereto. For example, in some embodiments, the lid 30 can be electrically grounded by way of the frame 38. It should be appreciated that the frame 38 can be any suitable material, such as, for example, metal or a composite material. For example, in certain embodiments, the frame 30 can comprise plated copper. The copper can be plated with, for example, nickel, tin, nickel-gold, and the like, although any suitable metal can be used (e.g., stainless steel). It should also be appreciated that the frame 38 can include one or more internal walls that are fixed and/or adjustable such that the sizes and shapes of the sub-cavities can be adjusted for different integrated device die applications. Advantageously, the one or more internal walls can prevent adjacent sub-cavities from electrically coupling. Further, in certain embodiments, it should be appreciated that the frame 38 can form a standalone feature or be integrally formed with either the substrate 40 and/or any feature(s) of the lid 30.

In FIG. 2, the RF absorber 34 and the partition 36 function as described above with reference to FIG. 1. For example, as with the embodiment of FIG. 1, the cover 32 can act as an RF shield while also providing separation between the RF absorber 34 and the die 26 so as to prevent outgassing from the absorber 34 from reaching the die 26. In certain embodiments, the cover 32 can comprise a metal to enable RF shielding and to block exit of RF waves not individually absorbed by the absorber 34. For example, in some embodiments, the cover 32 can comprise copper, a copper alloy, a metal alloy or any other suitable material capable of accomplishing these functions. The lid 30 may protect the die 26 from external forces and from dust and other foreign objects. The lid 30 can also provide a surface for handling and product marking.

Figure 3A:
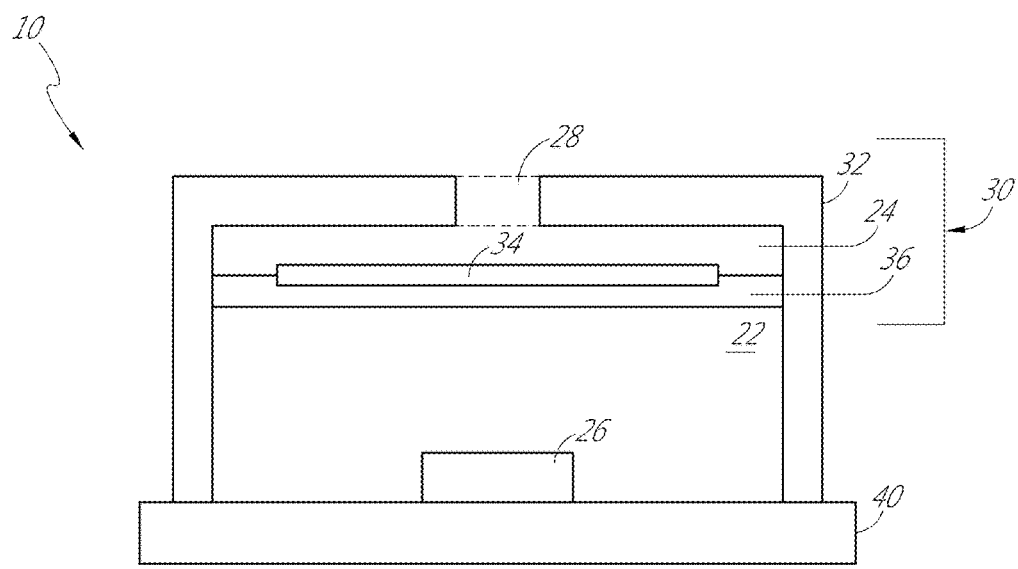
FIG. 3A is a schematic side cross-sectional view of a semiconductor package having a shaped lid, according to another embodiment.

FIG. 3A is a schematic side cross-sectional view of a semiconductor package 10 having a shaped lid 30, according to another embodiment. Unless otherwise noted, reference numerals in FIG. 3A refer to components that are the same or generally similar to those illustrated above in FIGS. 1 and 2. In FIG. 3A, the semiconductor package 10 includes a shaped lid 30. For example, the lid 30 shown in FIG. 3A is shaped to define a concavity, e.g., such that both the first and second cavities 22, 24 are formed at least in part by the concavity of the lid 30. Thus, in FIG. 3A, the first cavity 22 in which the die 26 is disposed is defined at least in part by the substrate 40, the cover 32, and the partition 36.

Figure 3B:
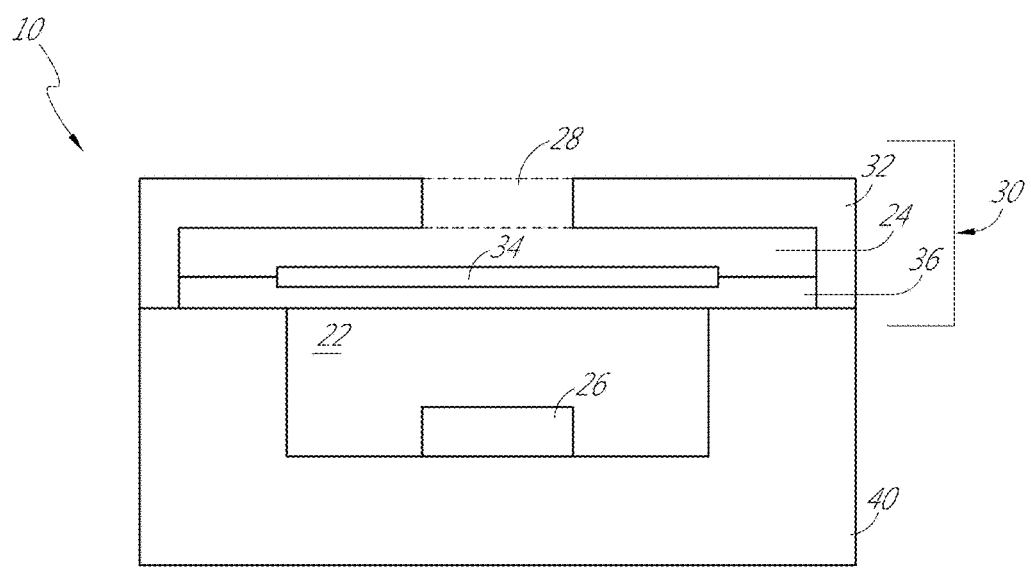
FIG. 3B is a schematic side cross-sectional view of a semiconductor package with a flat lid, according to another embodiment.

FIG. 3B is a schematic side cross-sectional view of a semiconductor package 10 with a flat lid 30, according to another embodiment. Unless otherwise noted, reference numerals in FIG. 3B refer components that are the same or generally similar to those illustrated above in FIGS. 1 and 2. Unlike the lid 30 of FIG. 3A, however, the lid 30 shown in FIG. 3B is flat such that the second cavity 24 is formed within the lid 30 and the first cavity 22 is defined by a bottom surface of the lid 30 and a recess of the substrate 40. Further, in both FIGS. 3A and 3B, the cover 32 includes one or more ventilation holes 28 to facilitate hydrogen diffusion out of the second cavity 24. As with the embodiments of FIGS. 1-2, the lids 30 of FIGS. 3A-3B can act as RF shields to contain RF waves within the package 10 while also isolating the die 26 from outgases emitted from the RF absorber 34. The partition 36 can allow RF waves to pass to the absorber 34.

FIGS. 4A-4D are side cross-sectional views of four different integrated device packages 10, according to various embodiments. Unless otherwise noted, reference numerals in FIGS. 4A-4D refer to components that are the same or generally similar to those illustrated above in FIGS. 1-3B. The packages 10 of FIGS. 4A-4D include frames 38 that have different shapes. In FIGS. 4A-4D, the respective frames 38 are mounted to the substrate 40 in different ways. As described above, the frame 38 can partly define the first cavity 22, or can partly define two or more sub-cavities. For example, while the frames 38 in FIGS. 4A-4C each define a single first cavity 22, the frame 38 in FIG. 4D defines two sub-cavities 22', 22" with two integrated device die 26', 26" disposed inside. However, it should be appreciated that the frame 38 can define any suitable number of sub-cavities.

Figure 4A:
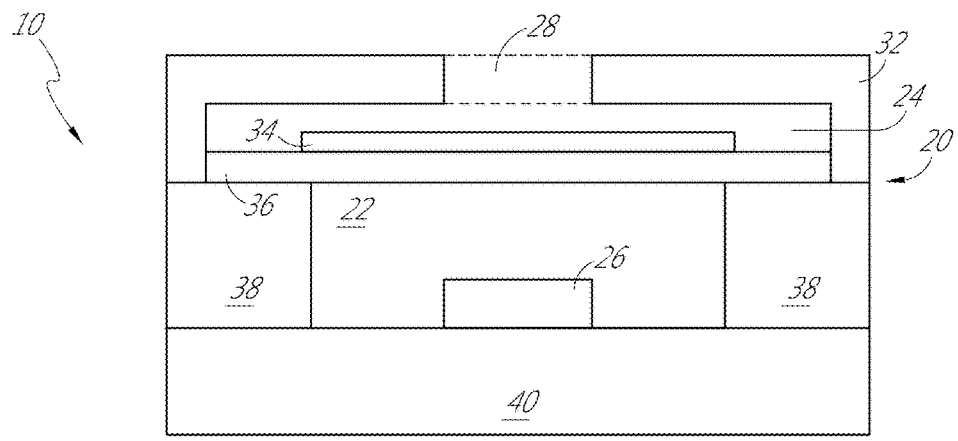
FIGS. 4A-4D are side cross-sectional views of four different integrated device packages, according to various embodiments.
Figure 4B:
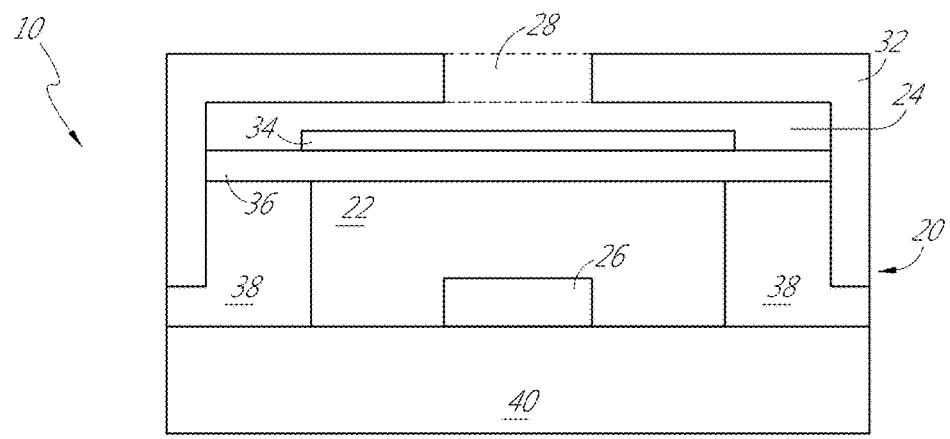
Figure 4C:
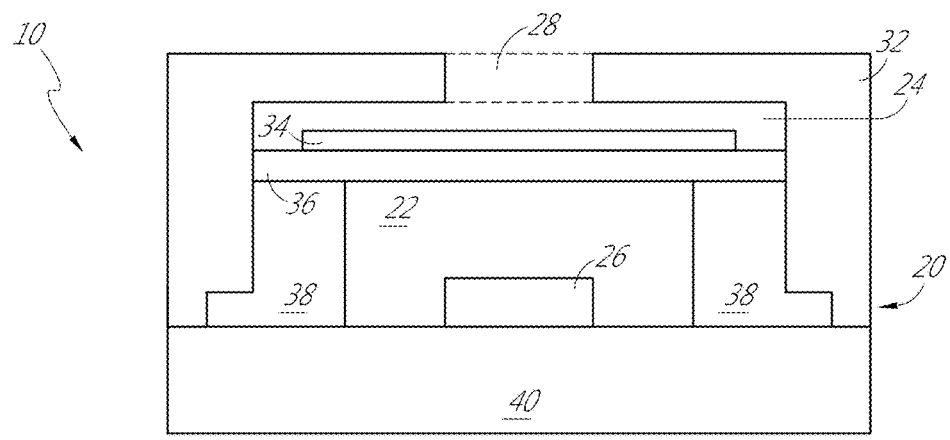
Figure 4D:
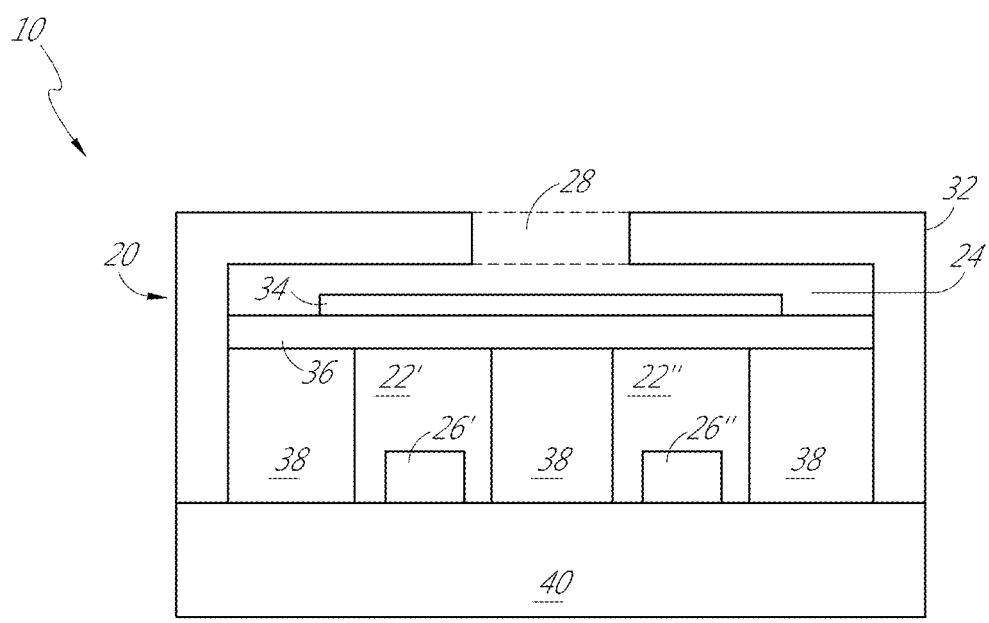

In addition, FIGS. 4A-4D illustrate four different ways in which the lid 32 can be attached to the substrate 40 and integrated within the semiconductor package 10. With reference to FIG. 4A, the cover 32 can be attached to a top surface of the frame 38, and the frame 38 can be attached to a top surface of the substrate 40. In FIG. 4A, the first cavity 22 can be defined by the top surface of the substrate 40, internal walls of the frame 38, and a bottom surface of the partition 36 (which can be part of the cover 32). By contrast, in FIG. 4B, the cover 32 can be attached to an inset surface and a top surface of the frame 38, and the frame 38 can be attached to a top surface of the substrate 40. In FIG. 4C, the cover 32 can be attached to the top surface of the substrate 40, in addition to inset and top surfaces of the frame 38, and the frame can be attached to the top surface of the substrate 40. With reference to FIG. 4D, the cover 32 can be attached to the top surface of the substrate 40, and the frame 38 can be attached to the top surface of the substrate 40. Of course, any suitable lid 32 attachment to the semiconductor package 10 may be provided. FIGS. 4A-4D also illustrate one or more ventilation holes 28 in the cover 32. As discussed above, the ventilation hole(s) 28 are sized and shaped to facilitate hydrogen diffusion out of the second cavity 24 to the outside environs.

Figure 5:
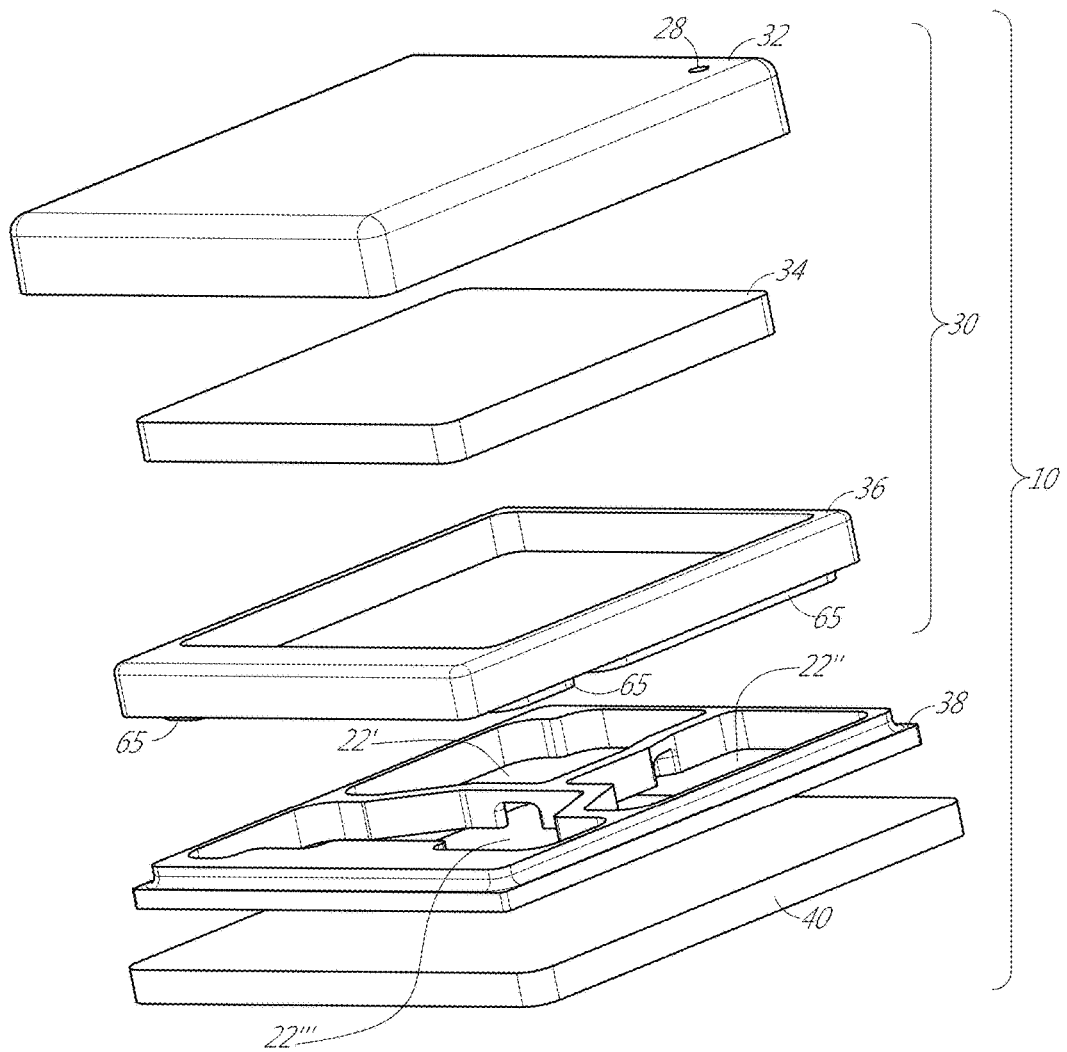
FIG. 5 is an exploded perspective view of a semiconductor package, according to another embodiment.
Figure 6A:
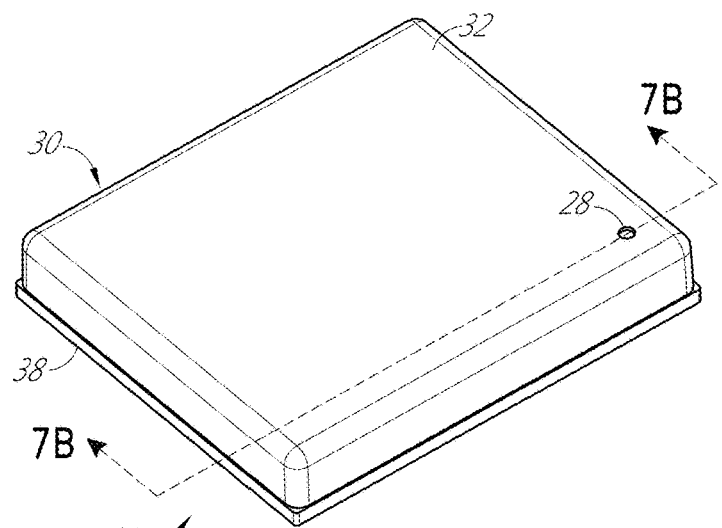
FIG. 6A is a front perspective view of the package shown in FIG. 5.
Figure 6B:
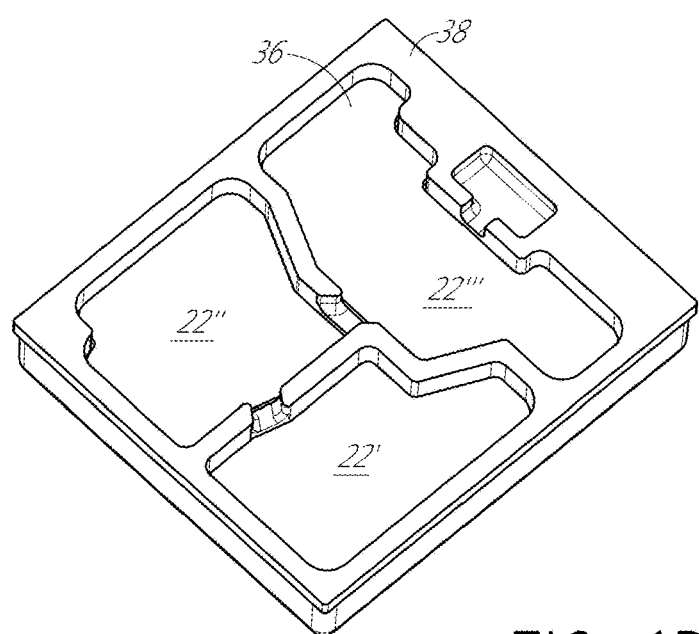
FIG. 6B is a bottom perspective view of the package shown in FIG. 5, with the substrate omitted for ease of illustration.
Figure 7A:
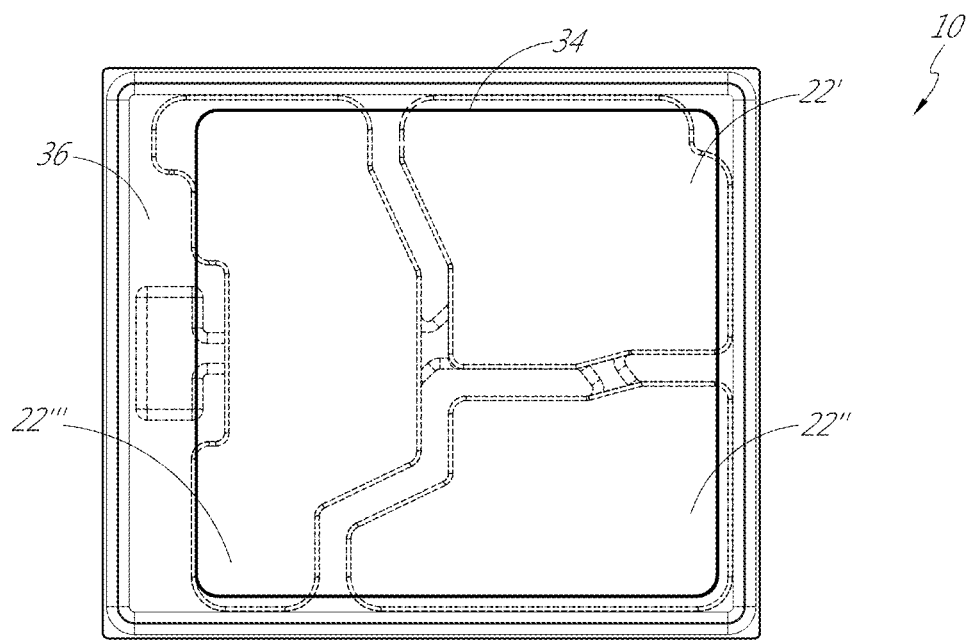
FIG. 7A is a top plan view of the package of FIGS. 5-6B with a portion of the cover shown transparent for purposes of illustration.
Figure 7B:
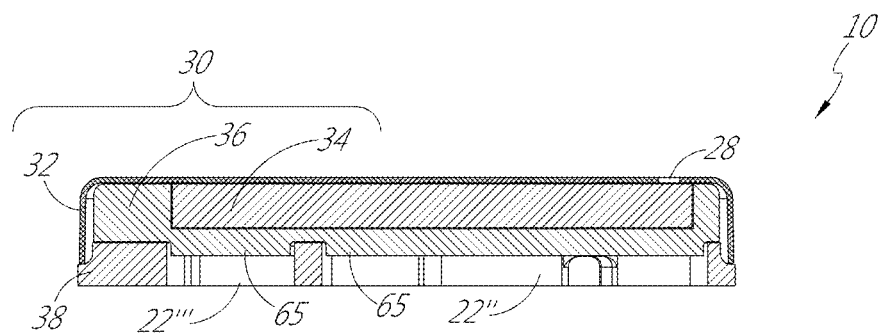
FIG. 7B is a side cross-sectional view of the package of FIG. 7A

FIG. 5 is an exploded perspective view of a semiconductor package 10, according to some embodiments. FIG. 6A is a front perspective view of the package 10 shown in FIG. 5. FIG. 6B is a bottom perspective view of the package 10 shown in FIG. 5, with the substrate 40 omitted for ease of illustration. FIG. 7A is a top plan view of the package 10 of FIGS. 5-6B with the cover shown transparent for purposes of illustration. FIG. 7B is a side cross-sectional view of the package of FIG. 7A through the cross section 7B-7B shown in FIG. 6A. Unless otherwise noted, reference numerals in FIGS. 5-7B refer to components that are the same or generally similar to those illustrated above in FIGS. 1-4D. For example, the lid 30 can be mounted to the substrate 40, which can be any suitable type of substrate, such as a PCB or leadframe. The lid 30 can include a partition 36 and a cover 32 which cooperate to define the second cavity 24, in which the RF absorber 34 can be disposed. For example, the partition 36 can comprise a recess formed in a top surface thereof to receive the RF absorber 34. The cover 32 of the lid 30 in FIGS. 5-7B can include one or more ventilation holes 28 to facilitate hydrogen diffusion out of the second cavity 24 (not shown), in which the RF absorber 34 is disposed. Of course, it should be appreciated that the one or more ventilation holes 28 can be formed at any suitable position on the cover 32, such as, for example, at a corner of the cover 32 as shown in FIG. 5, at the center of the cover 32, and/or on one or more sides of the cover 32. In some embodiments, the one or more ventilation holes 28 define an opening having an area in the range of 0.1 mm$^2$ to 3 mm$^2$, such as about 0.3 mm$^2$ to 2.5 mm$^2$, or any other suitable area. It should be appreciated that the one or more ventilation holes 28 can be any suitable size and any suitable shape, such as, for example, square and/or circular ventilation holes with any of the aforementioned areas, among others. In addition, as shown in FIGS. 5 and 7B, the partition 36 can comprise one or more protrusions 65 extending from a bottom surface of the partition 36. The protrusions 65 can be sized and shaped to fit within a portion of the cavity 22. In some embodiments, the protrusions 65 can help align and/or secure the partition 36 to the frame 38. In certain embodiments, the features depicted in FIGS. 5-7B can be designed for an integrated wave guide launch system.

In the embodiment of FIGS. 5-7B, the cover 32 can be mounted to the frame 38 such that the partition 36 and the RF absorber 34 are disposed between the cover 32 and the frame 38. For example, side walls of the cover 32 can be disposed around the partition 36 and can contact an upper surface of the frame 38. As shown in FIGS. 5, 6B, and 7A-7B, the frame 38 defines three sub-cavities 22', 22", 22'''. In some embodiments, the three sub-cavities 22', 22", 22''' act as metal-back shorts (also referred to as wave guide cavities) and can accommodate very high frequency RF devices, such as, for example, E-Band transmitter and receiver front ends. Although not illustrated in FIGS. 5-7B, three integrated device dies 26', 26", 26''' can be disposed in the three corresponding sub-cavities 22', 22", 22'''. However, it should be appreciated that any suitable number of integrated device dies can be disposed in sub-cavities 22', 22", 22'''. Further, it should be appreciated that some of the sub-cavities 22', 22", 22''' may not include an integrated device die. As described above, it should be appreciated that such dies can be any suitable die for any suitable application. Further, as shown in FIGS. 5 and 6B-7B, the sizes and shapes of the sub-cavities defined by the frame 38 can be different from one another, but in other embodiments, the sizes and/or shapes of the sub-cavities can be the same.

The cover 32 and the frame 38 can cooperate to form an RF shield for the package 10, as explained above in connection with FIG. 1. In various embodiments, the cover 32 and the frame 38 comprise a metal. For example, the cover 32 can comprise stainless steel in some embodiments, however, other metals may be suitable. As described above, the frame 38 can comprise plated copper in some embodiments. The partition 36 can be any material which can prevent outgassing from passing from the RF 34 absorber in the second cavity 24 to the integrated device die 26 in any of the first cavities 22. For example, the partition 36 can comprise a polymer, such as liquid crystal polymer (LCP). The frame 38 can be mounted and electrically connected to the substrate 40 by way of, e.g., a conductive adhesive. The frame 38 can be grounded to form an RF shield.

Figure 8:
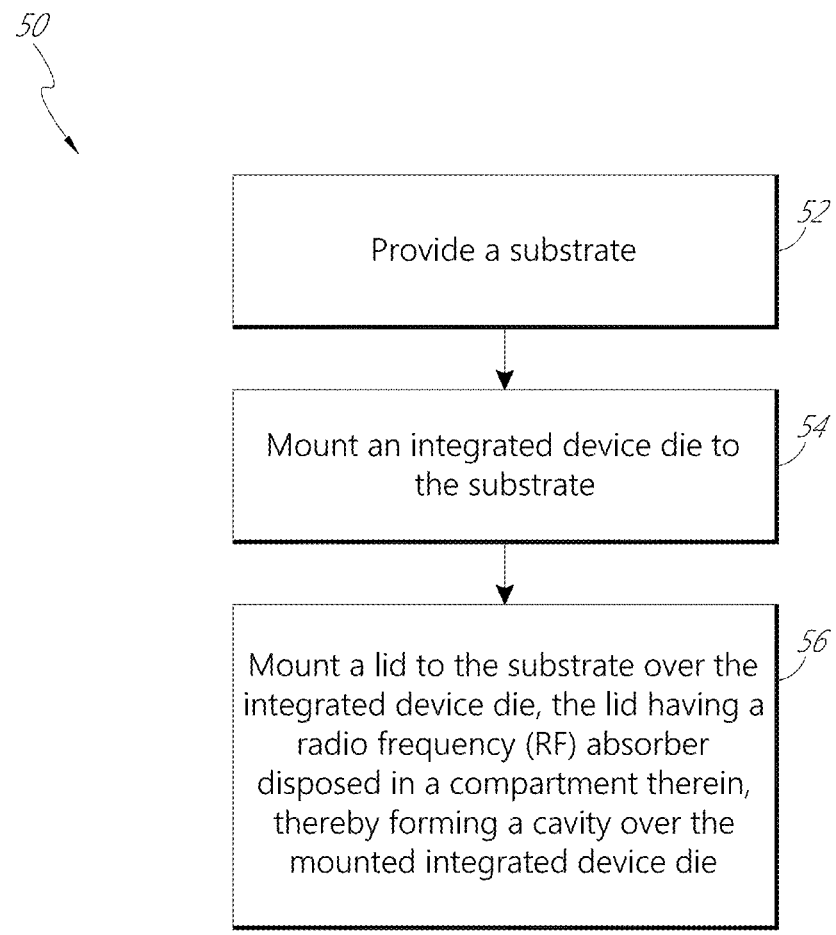
FIG. 8 is a simplified process flow for manufacturing a semiconductor package, according to various embodiments.

In addition, any of the embodiments described herein, any variations of the embodiments described herein, and/or any combinations of the features described herein can be manufactured with any suitable manufacturing method or process embodiment. For example, FIG. 8 is a flowchart illustrating process 50 for manufacturing the semiconductor packages 10 shown in FIGS. 1-7B, according to some embodiments. In various embodiments, the process 50 can include any number of the following steps, including more or fewer of the following steps, and in any suitable order.

Process 50 is illustrated in FIG. 8 and includes a block 52 providing a substrate. As described above, in certain embodiments, the substrate can comprise any suitable type of substrate, such as a leadframe, a flexible substrate or PCB. The substrate can comprise a generally planar substrate, or the substrate can include a recess sized to receive an integrated device die. The process 50 continues in a block 54 with mounting an integrated device die to the substrate. The integrated device die can comprise any suitable type of die, such as a high frequency die. The die can be mounted to the top surface of the substrate or in a recess of the substrate. The die can be electrically connected to the substrate in any suitable manner, e.g., by way of wire bonds or a flip chip connection. In a block 56, the process continues with mounting a lid to the substrate over the integrated device die, thereby forming a first cavity over the mounted integrated device die. The lid can include a component (such as an RF absorber) disposed in a compartment of the lid separate from the cavity. Of course, any suitable manufacturing process with any number of steps in a similar or dissimilar order may be possible.

Any system, method, and device described in this application can include any combination of the preceding features described in this and other paragraphs, among other features and combinations described herein, including features and combinations described in subsequent paragraphs.

Although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow. Moreover, language such as "up to," "at least," "greater than," "less than," "between," and the like includes the number recited. Numbers preceded by a term such as "approximately", "about", and "substantially" as used herein include the recited numbers (e.g., about 10%=10%), and also represent an amount close to the stated amount that still performs a desired function or achieves a desired result. For example, the terms "approximately", "about", and "substantially" may refer to an amount that is within less than 10% of, within less than 5% of, within less than 1% of, within less than 0.1% of, and within less than 0.01% of the stated amount.

What is claimed is:

1. A semiconductor package comprising:
   a substrate;
   a frame;
   an integrated device die mounted to the substrate, the integrated device die comprising a transmitter die; and
   a lid comprising a ventilation hole, the lid mounted to at least one of the frame and substrate over the integrated device die, wherein the lid, frame, and substrate at least partly define a cavity in which the integrated device die is disposed, the lid comprising a compartment formed therein, the compartment separated from the cavity by a partition,
   wherein the ventilation hole provides fluid communication between the compartment and the outside environs.

2. The semiconductor package of claim 1, further comprising a radio frequency (RF) absorber disposed in the compartment.

3. The semiconductor package of claim 1, wherein the cavity and the compartment are divided from each other by the partition.

4. The semiconductor package of claim 1, wherein the partition comprises plastic.

5. The semiconductor package of claim 2, wherein the RF absorber comprises nickel or iron.

6. The semiconductor package of claim 2, wherein the RF absorber releases hydrogen gas.

7. The semiconductor package of claim 1, wherein the ventilation hole is disposed at or near an upper surface of the compartment.

8. The semiconductor package of claim 3, wherein the cavity and the compartment are fluidly sealed from one another by the partition.

9. The semiconductor package of claim 2, wherein the integrated device die is isolated from the RF absorber disposed in the compartment.

10. The semiconductor package of claim 1, wherein the lid comprises a cover comprising a metal.

11. The semiconductor package of claim 10, wherein the cover is shaped to define a concavity.

12. The semiconductor package of claim 1, wherein no gettering material is disposed in the compartment or cavity.

13. The semiconductor package of claim 1, wherein the lid, the frame and the substrate at least partly define a second cavity in which a second integrated device die is disposed.

14. The semiconductor package of claim 13, wherein the cavity and the second cavity are separated by the frame.

15. The semiconductor package of claim 13, wherein the cavity and the second cavity are isolated from the compartment by the partition.

16. A method for manufacturing a semiconductor package, the method comprising:
   providing a substrate;
   mounting an integrated device die to the substrate;
   providing a frame over the substrate; and
   mounting a lid to the substrate over the integrated device die, the lid comprising a ventilation hole, wherein the lid, the frame and the substrate at least partly define a cavity in which the integrated device die is disposed, the lid comprising a compartment formed therein, the compartment separated from the cavity by a partition, the compartment being in fluid communication with the outside environs by way of the ventilation hole.

17. The method of claim 16, further comprising providing a radio frequency (RF) absorber disposed in the compartment.

18. The method of claim 16, wherein mounting the lid comprises dividing the cavity and the compartment.

19. The method of claim 16, wherein mounting the lid comprises fluidly sealing the cavity from the compartment.

20. A semiconductor package comprising:
   a substrate;
   a frame;
   a first integrated device die mounted to the substrate;
   a lid comprising a ventilation hole, the lid mounted to at least one of the frame and substrate over the integrated device die, wherein the lid, frame, and substrate at least partly define a first cavity in which the integrated device die is disposed, the lid, the frame and the substrate at least partly define a second cavity, the lid comprising a compartment formed therein, the compartment separated from the cavity by a partition; and
   a second integrated device die disposed in the second cavity,
   wherein the ventilation hole provides fluid communication between the compartment and the outside environs.

21. The semiconductor package of claim 20, wherein the first cavity and the second cavity are separated by the frame.

22. The semiconductor package of claim 21, wherein the first cavity and the second cavity are isolated from the compartment by the partition.

* * * * *